US011043401B2

(12) United States Patent
Umeki et al.

(10) Patent No.: US 11,043,401 B2
(45) Date of Patent: Jun. 22, 2021

(54) CERAMIC MEMBER

(71) Applicant: NGK SPARK PLUG CO., LTD., Nagoya (JP)

(72) Inventors: Toshiya Umeki, Sendai (JP); Tetsuo Kitabayashi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 487 days.

(21) Appl. No.: 15/941,040

(22) Filed: Mar. 30, 2018

(65) Prior Publication Data
US 2018/0308722 A1    Oct. 25, 2018

(30) Foreign Application Priority Data

Apr. 19, 2017  (JP) .............................. JP2017-083238
Sep. 5, 2017   (JP) .............................. JP2017-170141

(51) Int. Cl.
| | |
|---|---|
| *H01L 21/67* | (2006.01) |
| *H01C 1/02* | (2006.01) |
| *H01L 21/683* | (2006.01) |
| *H01J 37/32* | (2006.01) |
| *H05B 3/36* | (2006.01) |
| *H01L 21/687* | (2006.01) |

(Continued)

(52) U.S. Cl.
CPC ......... *H01L 21/67103* (2013.01); *H01C 1/02* (2013.01); *H01J 37/32724* (2013.01); *H01L 21/67109* (2013.01); *H01L 21/6831* (2013.01); *H01L 21/6833* (2013.01); *H01L 21/68757* (2013.01); *H01L 21/68785* (2013.01); *H05B 3/283* (2013.01); *H05B 3/36* (2013.01); *H05B 6/105* (2013.01)

(58) Field of Classification Search
CPC ......... H01L 21/67103; H01L 21/67109; H01L 21/6831; H01L 21/6833
See application file for complete search history.

(56) References Cited

U.S. PATENT DOCUMENTS 5,886,863 A  *  3/1999  Nagasaki ............ H01L 21/6831
                                                    279/128
2001/0037769 A1   11/2001  Fukuda et al.
(Continued)

FOREIGN PATENT DOCUMENTS

JP    2001-274102 A    10/2001
JP    4347295 B2       10/2009

*Primary Examiner* — Erin E McGrath
(74) *Attorney, Agent, or Firm* — Stites & Harbison, PLLC; Jeffrey A. Haeberlin; James R. Hayne

(57) ABSTRACT

A ceramic heater includes an RF plate having a placement surface on which a wafer is to be placed, and made of a ceramic sintered body in which an RF electrode is embedded; and a heater plate made of a ceramic sintered body in which a heater is embedded, the RF plate and the heater plate being joined with a space interposed therebetween on a side opposite to the placement surface. The relationship among a minimum height H (mm) of the space in a direction perpendicular to the placement surface, a proportion A of a total area of portions where the RF plate and the heater plate are joined, with respect to an area of a plane along the placement surface that is defined by an outer edge of the placement surface, and a distance D (mm) between the RF electrode and the heater, satisfies $H/A \leq 1000$ and $H/A+(D-H)/(1-A) \geq 14$.

8 Claims, 2 Drawing Sheets

(51) Int. Cl.
  *H05B 3/28* (2006.01)
  *H05B 6/10* (2006.01)

(56) References Cited

U.S. PATENT DOCUMENTS

| | | | |
|---|---|---|---|
| 2006/0076109 A1* | 4/2006 | Holland | H01L 21/6831 |
| | | | 156/345.27 |
| 2006/0102849 A1* | 5/2006 | Mertens | G03F 7/70716 |
| | | | 250/440.11 |
| 2006/0151117 A1 | 7/2006 | Kasanami et al. | |
| 2008/0223524 A1 | 9/2008 | Kasanami et al. | |
| 2009/0114158 A1* | 5/2009 | Zucker | C23C 14/541 |
| | | | 118/729 |
| 2009/0277588 A1 | 11/2009 | Kasanami et al. | |

\* cited by examiner

CERAMIC MEMBER

CROSS REFERENCE TO RELATED APPLICATIONS

The present application claims priority to Japanese Patent Application No. 2017-083238, filed Apr. 19, 2017, and to Japanese Patent Application No. 2017-170141, filed Sep. 5, 2017, the disclosures of which are herein incorporated by reference in their entirety.

BACKGROUND OF THE INVENTION

Field of the Invention

The present invention relates to a ceramic member formed of a ceramic sintered body in which an electrode and a heating resistor are embedded.

Description of Related Art

There are ceramic members such as a susceptor formed by joining an RF plate to which an RF electrode is provided, and a heater plate to which a heating resistor is provided.

Patent Document 1 describes that a susceptor is formed by fixing a placement susceptor member, an upper susceptor plate, and a lower susceptor plate in a state in which they are stacked with an adhesive or by heat welding. A heater (heating resistor) is provided in a recessed heater providing space formed on the upper surface of the upper susceptor plate, and an electrode (RF electrode) with variable impedance is provided in a recessed electrode providing space formed on the upper surface of the lower susceptor plate.

The placement susceptor member and the two susceptor plates are made of quartz, the heater providing space is in communication with the atmosphere, and a gap is present between the upper susceptor plate and the heater. This is because heating of the substrate placed on the upper surface of the placement susceptor member by the heater is achieved with radiant heat transfer by infrared radiation.

Patent Document 2 describes that an RF electrode and a heater are embedded inside a susceptor made of ceramic such as aluminum nitride.

RELATED ART DOCUMENTS

Patent Document 1 is Japanese Patent No. 4347295.
Patent Document 2 is Japanese Patent Application Laid-Open (kokai) No. 2001-274102.

BRIEF SUMMARY OF THE INVENTION

However, the susceptor described in Patent Document 1 needs to allow the infrared radiation to transmit therethrough, and therefore, the parent material of the susceptor is limited to materials through which infrared radiation transmits, such as quartz. In addition, the heat generated from the heater is not readily transferred through the parent material, so that the heater may cause breaking of wire due to an excessive temperature increase.

On the other hand, in the case where the RF electrode and the heater are embedded into the susceptor using a material having a larger thermal conductivity such as aluminum nitride as the parent material as described in Patent Document 2, the heat from the heater is readily transferred through the parent material. However, as the usage temperature of the susceptor increases, the insulating property of aluminum nitride is reduced, resulting in generation of leak current between the RF electrode and the heater. As a result, even when a predetermined power is supplied to the heater, it is difficult to heat the substrate (wafer) placed on the susceptor to the desired temperature.

The present invention has been made in view of such circumstances, and an object of the invention is to provide a ceramic member capable of suppressing the generation of leak current and facilitating the heating of the wafer to the desired temperature.

The present invention is directed to a ceramic member including: a first base body having a placement surface on which a wafer is to be placed, and made of a ceramic sintered body in which an electrode is embedded; and a second base body made of a ceramic sintered body in which a heating resistor is embedded. The first base body and the second base body are joined to each other with a space interposed therebetween on a side opposite to the placement surface of the first base body. A relationship among a minimum height, H (mm), of the space in a direction perpendicular to the placement surface, a proportion, A, of a total area of portions where the first base body and the second base body are joined to an area of a plane along the placement surface that is defined by an outer edge of the placement surface, and a distance, D (mm), between the electrode and the heating resistor, satisfies H/A≤1000 and H/A+(D−H)/(1−A)≥14.

According to the present invention, the space interposed between the first base body and the second base body can suppress excessive inhibition of the heat transfer from the heating resistor to the placement surface, and suppress the generation of leak current flowing between the electrode and the heating resistor.

In the present invention, it is preferable that the relationship satisfies H/A+(D−H)/(1−A)≥100.

In this case, it is possible to further suppress the generation of the leak current flowing between the electrode and the heating resistor.

In the present invention, it is preferable that the space is at least partially filled with a medium having a higher thermal conductivity than that of air, or is configured to be connectable with (i.e., in communication with) a supply source of the medium.

In this case, by controlling the pressure of the medium present in the space, it is possible to control the heat transfer between the first base body and the second base body, while suppressing the generation of the leak current.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A ceramic heater 100 according to an embodiment of the ceramic member of the present invention will be described with reference to the drawings. It is noted that the drawings described below illustrate various components in a deformed manner in order to clarify the configuration of the ceramic heater 100, and does not indicate the actual proportions.

Figure 1:
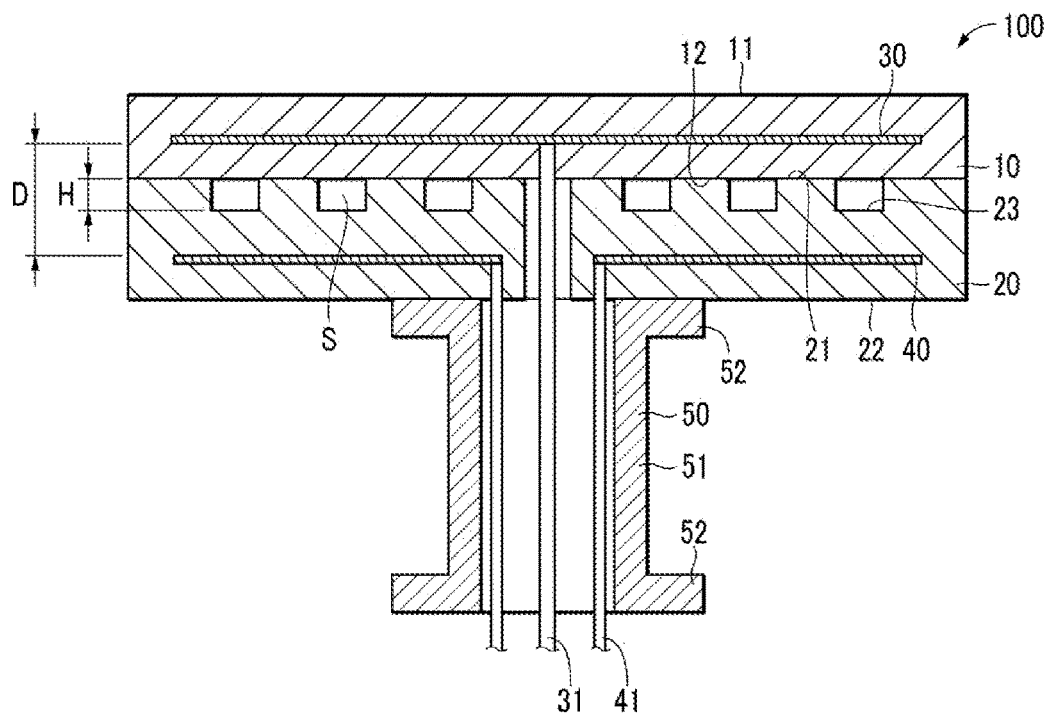
FIG. 1 is a schematic cross-sectional view of a ceramic heater according to an embodiment of the present invention.

As shown in FIG. 1, the ceramic heater 100 is configured by stacking an RF plate 10 having, as its upper surface, a placement surface 11 on which a wafer (substrate), which is an object to be heated (not shown), is to be placed, and a heater plate 20. It is noted that the RF plate 10 corresponds to the first base body of the present invention, and the heater plate 20 corresponds to the second base body of the present invention.

An RF electrode 30 is embedded in the RF plate 10, and a heater (heating resistor) 40 is embedded in the heater plate 20. The RF electrode 30 is a high-frequency electrode that is used when plasma treatment is performed on the wafer.

In the present embodiment, the RF electrode 30 is made of a foil of, for example, a heat resistant metal such as molybdenum (Mo) or tungsten (W), and has a planar configuration. However, the RF electrode 30 may be composed of a film, a plate, a mesh, fibers, or the like made from a heat resistant metal or the like.

The RF plate 10 and the heater plate 20 may each be, for example, a ceramic base material formed of a ceramic sintered body such as alumina, aluminum nitride, silicon nitride, or the like. As the RF plate 10 and the heater plate 20, an aluminum nitride sintered body containing a sintering additive such as yttria and having a purity of 90% or more can be particularly preferably used. The RF plate 10 and the heater plate 20 may be produced by molding the above-described material in a mold having a predetermined shape and then forming the resultant molding into a plate shape such as a disk shape by, for example, hot-press sintering, so as to be densified.

In the present embodiment, the heater 40 is made of a mesh of, for example, a heat resistant metal such as molybdenum (Mo) or tungsten (W), and has a planar configuration. However, the heater 40 may be composed of a foil, a film, a plate, a wire, fibers, a coil, a ribbon, or the like made of a heat resistant metal or the like.

The RF plate 10 is sintered with the RF electrode 30 inserted into a ceramic material that will constitute the RF plate 10. The heater plate 20 is sintered with the heater 40 inserted into a ceramic material that will constitute the heater plate 20.

The RF plate 10 and the heater plate 20 are produced separately, and thereafter are joined such that a lower surface 12 of the RF plate 10 and an upper surface 21 of the heater plate 20 are in contact with each other. However, the lower surface 12 of the RF plate 10 and the upper surface 21 of the heater plate 20 are in contact with each other not over the entire surfaces so that spaces (gaps) S are interposed at least between the RF plate 10 and the heater plate 20.

The RF plate 10 and the heater plate 20 are fixed by diffusion joining, an adhesive, mechanical joining using a fixture such as a screw, or the like.

Furthermore, the ceramic heater 100 includes a power-feeding terminal (power feed terminal) 31 for supplying power to the RF electrode 30, and a current supply member (not shown) embedded in the RF plate 10.

In addition, the ceramic heater 100 includes a power-feeding terminal (power feed terminal) 41 for supplying power to the heater 40, and a current supply member (not shown) embedded in the heater plate 20.

The terminals 31, 41 and the respective current supply members are brazed or welded to each other. The terminals 31, 41 are each formed from a heat resistant metal such as nickel (Ni), Kovar (registered trademark) (Fe—Ni—Co), molybdenum (Mo), tungsten (W), or a heat resistant alloy mainly composed of molybdenum (Mo) and tungsten (W), which is in the form of a rod or a wire. The current supply members are made of molybdenum (Mo), tungsten (W), or the like. It is noted that the terminals 31, 41 and the current supply member may be connected with each other via a connection member made of the same heat resistant metal as those of the terminals 31, 41.

The ceramic heater 100 further includes a hollow shaft 50 connected to the central portion of the lower surface 22 of the heater plate 20.

The shaft 50 roughly has a cylindrical shape, and has, at a part joined to the heater plate 20, a large diameter portion 52 having a larger outer diameter than the other cylindrical portion 51. The upper surface of the large diameter portion 52 constitutes a surface joined to the heater plate 20. The material of the shaft 50 may be equal to that of the heater plate 20, or may be formed from a material having a lower thermal conductivity than that of the heater plate 20 for the purpose of enhancing the heat insulation property.

The lower surface of the heater plate 20 and the upper end face of the shaft 50 are joined by diffusion joining, or solid phase joining using a joining material such as ceramic or glass. It is noted that the heater plate 20 and the shaft 50 may be connected by screwing, brazing, or the like.

In the embodiment shown in FIG. 1, a plurality of recessed portions 23 are formed on the upper surface 21 of the heater plate 20, and the spaces S are formed between the recessed portions 23 and the lower surface 12 of the RF plate 10. Although not shown, the recessed portions may be formed on the lower surface 12 of the RF plate 10, or the recessed portions may be formed on both the lower surface 12 of the RF plate 10 and the upper surface 21 of the heater plate 20. Also, each space S may be a closed space, or a space in communication with the outside, or the spaces S may, or may not be in communication with each other.

The spaces S interposed between the RF plate 10 and the heater plate 20 can suppress flow of a leak current from the heater 40 to the RF electrode 30.

However, the heat generated from the heater 40 needs to be transferred so as to heat the wafer supported on the placement surface 11. Therefore, the size of the spaces S interposed between the RF plate 10 and the heater plate 20 should not be greater than necessary. On the basis of examples and comparative examples described later, the inventor has found that, where H [mm] represents the minimum height of the spaces S in a direction perpendicular to the placement surface 11, and A represents the proportion of the contact area between the RF plate 10 and the heater plate 20, the following relational expression (1) needs to be satisfied:

$$H/A \leq 1000 \qquad (1)$$

It is noted that the proportion A is the proportion of the total area of the portions where the lower surface 12 of the RF plate 10 and the upper surface 21 of the heater plate 20 are in contact with each other, with respect to the area of the plane along the placement surface 11 that is defined by the outer edge of the placement surface 11.

Figure 3:
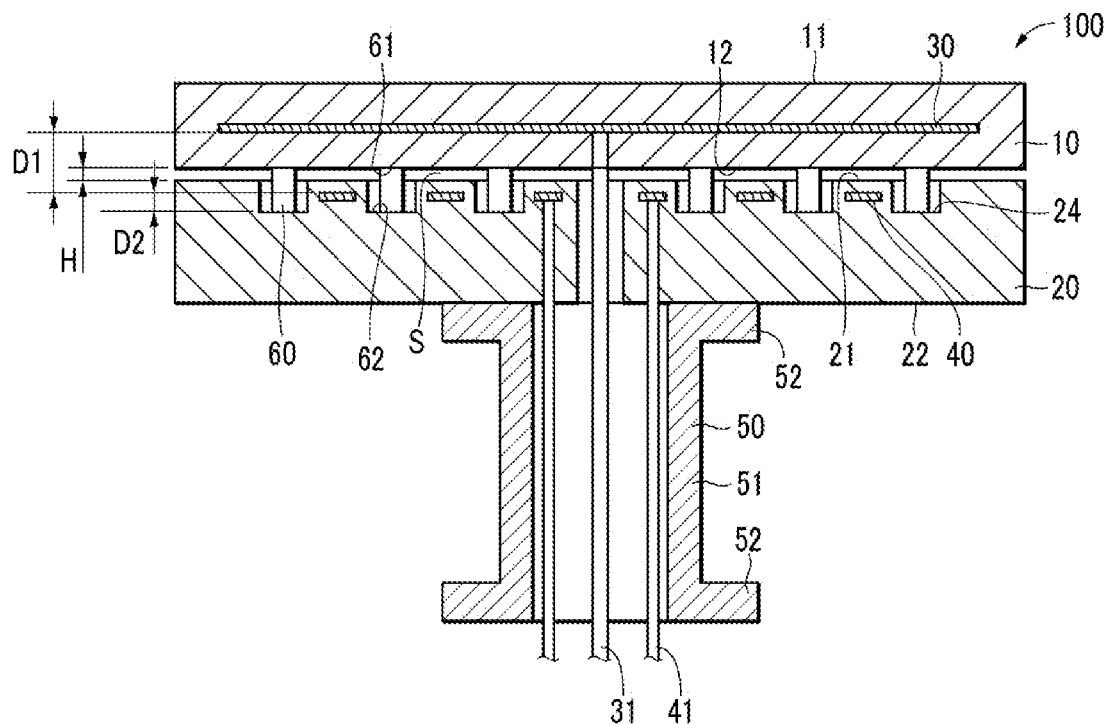
FIG. 3 is a schematic cross-sectional view of a ceramic heater according to another modification of the embodiment of the present invention.

Furthermore, as in a modification shown in FIG. 3, the following configuration may be employed: a plurality of recessed portions 24 are formed on the upper surface 21 of the heater plate 20; and connection members 60, such as pins, having a larger length in the axial direction than the depth of the recessed portions 24 are disposed in the recessed portions 24; upper surfaces 61 of the connection members 60 are joined to the lower surface 12 of the RF plate 10; and the lower surfaces 62 of the connection members 60 are joined to the bottom surfaces of the recessed portions 24. It is noted that as shown in FIG. 3, the bottom surfaces of the recessed portions 24 may be formed at positions that are more distant from the upper surface 21 of the heater plate 20 than the heater 40.

Accordingly, the lower surface 12 of the RF plate 10 and the upper surface 21 of the heater plate 20 are not in contact with each other over the entire surfaces, and the space S present around the connection members 60 is formed therebetween. Although not shown, the recessed portions may be formed on the lower surface 12 of the RF plate 10, and the connection members 60 may be disposed on the bottom surfaces of the recessed portions. Alternatively, the connection members 60 may be directly joined to a flat surface of one or both of the lower surface 12 of the RF plate 10 and the upper surface 21 of the heater plate 20.

It is noted that the connection members 60 may be made of the same material as, or a material different from, the materials of the RF plate 10 and the heater plate 20. The RF plate 10 and the heater plate 20 may be joined to the connection members 60 by diffusion joining, an adhesive, or the like. In the case where the connection members 60 are made of the same material as the materials of the RF plate 10 and the heater plate 20, the connection members 60 may be formed integrally with the RF plate 10 or the heater plate 20 by cutting work or the like of ceramic base material. The connection members 60 may have a columnar shape, a prismatic shape, a cylindrical shape, or the like. There is no limitation on the shape of the connection members 60, and the configuration thereof is not limited to a scattered configuration.

In such a case, the connection members 60 can be considered as members constituting a part of the first base body or a part of the second base body of the present invention. Also, the proportion A is a proportion of the smaller one of the total contact area between the lower surface 12 of the RF plate 10 and the upper surfaces 61 of the connection members 60, and the total contact area between the upper surface 21 of the heater plate 20 and the lower surfaces 62 of the connection members 60, with respect to the area of the plane along the placement surface 11 that is defined by the outer edge of the placement surface 11.

Furthermore, as the temperatures of the RF plate 10 and the heater plate 20 are increased by heating through heat transfer of the heat generated from the heater 40, the insulating properties of the parent materials thereof are reduced. This results in an increase in the magnitude of the leak current generated between the RF electrode 30 and the heater 40. When the leak current becomes excessive, the capacity of a power supply that feeds power to the ceramic heater 100 becomes insufficient, so that it becomes very difficult to perform temperature control.

Therefore, the spaces S are provided in order to suppress the generation of the leak current generated between the RF electrode 30 and the heater 40. On the basis of examples and comparative examples described later, the inventor has found that, where H [mm] represents the minimum height of the spaces S in a direction perpendicular to the placement surface 11, A represents the proportion of the contact area between the RF plate 10 and the heater plate 20, and D [mm] represents the distance between the RF electrode 30 and the heater 40 in a vertical direction that is perpendicular to the placement surface 11, in order to suppress an excessive leak current, the following relational expression (2) needs to be satisfied:

$$H/A + (D-H)/(1-A) \geq 14 \quad (2)$$

In order to further suppress the leak current, it is preferable that the following relational expression (3) is satisfied:

$$H/A + (D-H)/(1-A) \geq 100 \quad (3)$$

It is noted that the distance D is the separation length between the RF electrode 30 and the heater 40 in the vertical direction, and takes the same value regardless of whether or not the RF electrode 30 and the heater 40 overlap in the vertical direction. Also, the distance D is the distance between the lower end of the RF electrode 30 and the upper end of the heater 40 in the vertical direction. For example, when the heater 40 is formed at various positions in the vertical direction, the distance D is the distance from the upper end of the heater 40 in the uppermost layer.

It is noted that as in the modification shown in FIG. 3, in the case where the shortest route connecting the RF electrode 30 and the heater 40 without passing through the space S has an overlapping portion in a vertical direction that is perpendicular to the placement surface 11, the distance D is a distance obtained by adding twice the length (distance from the bottom surfaces of the recessed portions 24 to the heater 40) D2 of the overlapping portion in the vertical direction, to the separation length D1 between the RF electrode 30 and the heater 40 in the vertical direction. Therefore, the distance D is represented by the expression (4):

$$D = D1 + 2 \times D2 \quad (4)$$

Furthermore, as in the modification shown in FIG. 3, it is preferable that the space S is interposed within a range connecting the RF electrode 30 and the heater 40 in the vertical direction. This makes it possible to efficiently suppress the generation of leak current between the RF electrode 30 and the heater 40. In this case, the space S may be partly interposed within a range connecting the RF electrode 30 and the heater 40 in the vertical direction.

Although not shown, pipes may be connected to the spaces S. Then, a gas such as helium, argon, nitrogen, or the like may be supplied from a gas supply source connected to the pipes so that the gas pressure in the spaces S can be adjusted. In this case, it is possible to easily control the ease of heat transfer between the RF plate 10 and the heater plate 20 by adjusting the gas pressures in the spaces S, while suppressing the generation of leak current. It is noted that, also in this case, each space S may be a closed space, or may be an open space.

Furthermore, although not shown, a reflection plate in which a reflection member is embedded may be additionally provided below the heater plate 20, or the reflection member may be embedded, below the heater 40, in the heater plate 20. The reflection member has an effect of efficiently reflecting the radiation heat from the heater 40, thereby suppressing the power consumption of the heater 40. The reflection member is made of, for example, a high-melting point metal such as nickel, molybdenum, tungsten, platinum, palladium, or a platinum-palladium alloy, and the upper surface thereof is formed as a mirror surface.

EXAMPLES

Hereinafter, the present invention will be described with reference to examples and comparative examples of the present invention specifically.

Examples 1 to 40

In Examples 1 to 40, the RF plate 10 made of an aluminum nitride (AlN) sintered body in which the RF electrode 30 was embedded, and the heater plate 20 made of aluminum nitride in which the heater 40 was embedded were joined and stacked, thereby obtaining the ceramic heater 100 shown in FIG. 1.

Production of Ceramic Heater

The RF plate 10 was made of an aluminum nitride sintered body having a diameter of 340 mm, a thickness of 4 mm, and a purity of 95% or more. In an intermediate portion of the RF plate 10 in the thickness direction, an RF electrode 30 made of a Mo foil having a circular shape in plan view and having a thickness of 0.1 mm and a diameter of 300 mm was embedded. To the aluminum nitride sintered body, yttria was added as a sintering additive.

Figure 4:
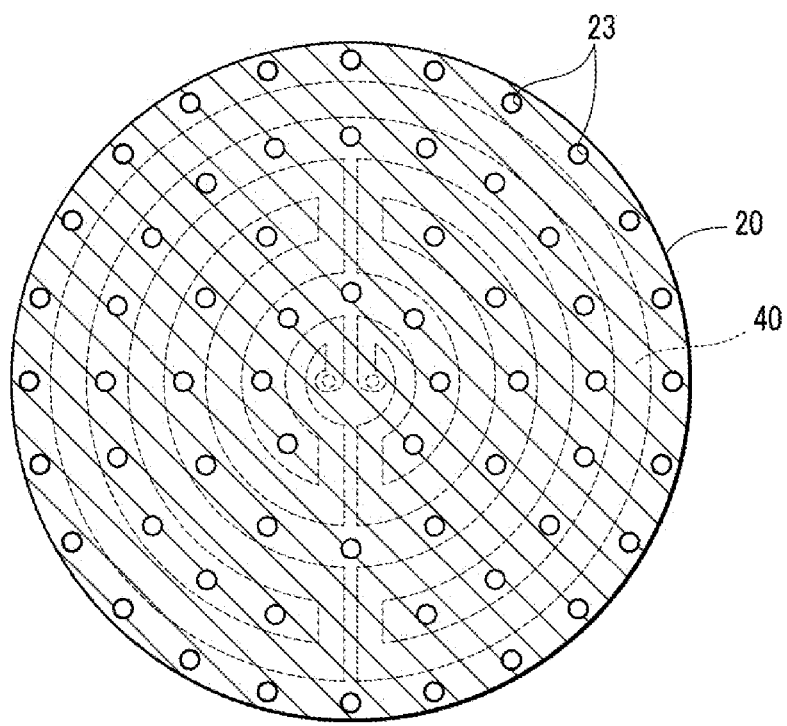
FIG. 4 is a schematic horizontal cross-sectional view of a ceramic heater according to Example 41.

The heater plate 20 was made of an aluminum nitride sintered body having a diameter of 340 mm and a purity of 95% or more, and a heater 40 made of a Mo mesh (wire diameter 0.1 mm, #50, plain weave) was embedded 8 mm above the lower surface 22 of the heater plate 20. To the aluminum nitride sintered body, yttria was added as a sintering additive. As shown in FIG. 4, the heater 40 had a plurality of concentrically-arranged arc-shaped patterns and linear patterns that connect radially adjacent arc-shaped patterns. The diameter of the outermost arc-shaped pattern was 310 mm. The heater plate 20 had a thickness of 16 mm in Examples 1 to 34, and had a thickness of 26 mm in Examples 35 to 40. The volume resistivity of the aluminum nitride sintered body at 650° C. was $1.0 \times 10^8$ Ω·cm.

A plurality of recessed portions 23 were formed on the upper surface 21 of the heater plate 20 by grinding using a machining center. The height of the recessed portions 23, i.e., the minimum height H of the spaces S was 0.02 mm to 12 mm, and the proportion A of the contact area between the RF plate 10 and the heater plate 20 was 0.001 (0.1%) to 0.5 (50%).

The RF plate 10 and the heater plate 20 were joined by diffusion joining in which they were heated to 1700° C. under vacuum with a pressure of 8 MPa applied to the joining surfaces. The upper end face of the shaft 50 made of an aluminum nitride sintered body was joined to the lower surface 22 of the heater plate 20 by diffusion joining. The diffusion joining at that time was performed by heating to 1600° C. under vacuum with a pressure of up to 8 MPa applied to the joining surfaces.

After joining the shaft 50, power feed terminals 31, 41 made of nickel were joined to the RF electrode 30 and the heater 40 at 1000° C. by vacuum brazing using a gold brazing material.

Evaluation Method

A blackened dummy wafer was placed on the placement surface 11 of the ceramic heater 100, and power was supplied to the terminal 41 to increase the temperature of the heater 40. Then, the temperature of the surface of the dummy wafer was measured with an IR camera. For 15 minutes from the time when the surface temperature of the dummy wafer had reached 600° C., the power supplied to the terminal 41 was made constant. It is noted that the RF electrode 30 was grounded.

Thereafter, the temperatures of the RF plate 10 and the heater plate 20 were measured, and the difference therebetween was determined. Specifically, the temperatures of the RF plate 10 and the heater plate 20 were measured by providing in advance a thermocouple measurement hole (not shown) having a bottom at an intermediate position in the thickness direction of each of the RF plate 10 and the heater plate 20, in a central region of the ceramic heater 100, and then inserting a sheath thermocouple (a stainless-steel sheath of the type K and having a diameter of 1.6 mm) into the thermocouple measurement hole.

Also, the leak current generated between the RF electrode 30 and the heater 40 was measured. The leak current was measured by connecting an AC ammeter to a path between the power feed terminal 31 connected to the RF electrode 30 and the ground.

Evaluation Results

The temperature difference between the RF plate 10 and the heater plate 20 was 1.5° C. to 185.5° C., which was as small as less than 200° C., and H/A was 0.04 to 1000, so that the relational expression (1) was satisfied.

The leak current generated between the RF electrode 30 and the heater 40 was 0.01 mA to 0.99 mA, which was as small as less than 1 mA, and H/A+(D−H)/(1−A) was 14.3 to 1010, so that the relational expression (2) was satisfied.

Furthermore, in Examples 8, 12, 17, 18, 22, 26, 30, 34, 35, and 38, the leak current generated between the RF electrode 30 and the heater 40 was 0.01 mA to 0.13 mA, which was as very small as less than 0.15 mA, and H/A+(D−H)/(1−A) was 109 to 1010, so that the relational expression (3) was satisfied.

The results of Examples 1 to 40 are collectively shown in Tables 1 and 2.

TABLE 1

| | Space height H [mm] | Contact area proportion A | Distance D [mm] | H/A | H/A+ (D−H)/ (1−A) | Leak current [mA] | Temperature difference [° C.] |
|---|---|---|---|---|---|---|---|
| Ex. 1 | 0.02 | 0.001 | 10 | 20 | 30.0 | 0.47 | 5.1 |
| Ex. 2 | 0.02 | 0.3 | 10 | 0.07 | 14.3 | 0.99 | 1.5 |
| Ex. 3 | 0.02 | 0.5 | 10 | 0.04 | 20.0 | 0.71 | 1.5 |
| Ex. 4 | 0.05 | 0.001 | 10 | 50.0 | 60.0 | 0.24 | 10.7 |
| Ex. 5 | 0.05 | 0.01 | 10 | 5.0 | 15.1 | 0.94 | 2.4 |
| Ex. 6 | 0.05 | 0.3 | 10 | 0.17 | 14.4 | 0.98 | 1.5 |
| Ex. 7 | 0.05 | 0.5 | 10 | 0.1 | 20.0 | 0.71 | 1.5 |
| Ex. 8 | 0.1 | 0.001 | 10 | 100 | 110 | 0.13 | 19.9 |
| Ex. 9 | 0.1 | 0.01 | 10 | 10.0 | 20.0 | 0.71 | 3.3 |
| Ex. 10 | 0.1 | 0.3 | 10 | 0.33 | 14.5 | 0.98 | 1.5 |
| Ex. 11 | 0.1 | 0.5 | 10 | 0.2 | 20.0 | 0.71 | 1.5 |
| Ex. 12 | 0.5 | 0.001 | 10 | 500 | 510 | 0.03 | 93.4 |
| Ex. 13 | 0.5 | 0.01 | 10 | 50 | 60.0 | 0.24 | 10.6 |
| Ex. 14 | 0.5 | 0.1 | 10 | 5.0 | 15.6 | 0.91 | 2.3 |
| Ex. 15 | 0.5 | 0.3 | 10 | 1.67 | 15.2 | 0.93 | 1.7 |
| Ex. 16 | 0.5 | 0.5 | 10 | 1.0 | 20.0 | 0.71 | 1.6 |
| Ex. 17 | 1.0 | 0.001 | 10 | 1000 | 1009 | 0.01 | 185.3 |
| Ex. 18 | 1.0 | 0.01 | 10 | 100 | 109 | 0.13 | 19.7 |
| Ex. 19 | 1.0 | 0.1 | 10 | 10.0 | 20.0 | 0.71 | 3.1 |
| Ex. 20 | 1.0 | 0.3 | 10 | 3.3 | 16.2 | 0.87 | 1.9 |
| Ex. 21 | 1.0 | 0.5 | 10 | 2.0 | 20.0 | 0.71 | 1.7 |

TABLE 2

| | Space height H [mm] | Contact area proportion A | Distance D [mm] | H/A | H/A+ (D−H)/ (1−A) | Leak current [mA] | Temperature difference [° C.] |
|---|---|---|---|---|---|---|---|
| Ex. 22 | 2.0 | 0.01 | 10 | 200 | 208 | 0.07 | 37.9 |
| Ex. 23 | 2.0 | 0.1 | 10 | 20.0 | 20.0 | 0.49 | 4.8 |
| Ex. 24 | 2.0 | 0.3 | 10 | 6.7 | 18.1 | 0.78 | 2.3 |
| Ex. 25 | 2.0 | 0.5 | 10 | 4.0 | 20.0 | 0.71 | 1.8 |
| Ex. 26 | 3.0 | 0.01 | 10 | 300 | 307 | 0.05 | 56.1 |
| Ex. 27 | 3.0 | 0.1 | 10 | 30.0 | 38.0 | 0.37 | 6.4 |
| Ex. 28 | 3.0 | 0.3 | 10 | 10.0 | 20.0 | 0.71 | 2.8 |

TABLE 2-continued

|  | Space height H [mm] | Contact area proportion A | Distance D [mm] | H/A | H/A+ (D−H)/ (1−A) | Leak current [mA] | Temperature difference [° C.] |
|---|---|---|---|---|---|---|---|
| Ex. 29 | 3.0 | 0.5 | 10 | 6.0 | 20.0 | 0.71 | 2.0 |
| Ex. 30 | 4.0 | 0.01 | 10 | 400 | 406 | 0.03 | 74.3 |
| Ex. 31 | 4.0 | 0.1 | 10 | 40.0 | 47.0 | 0.30 | 8.1 |
| Ex. 32 | 4.0 | 0.3 | 10 | 13.3 | 22.0 | 0.65 | 3.2 |
| Ex. 33 | 4.0 | 0.5 | 10 | 8.0 | 20.0 | 0.71 | 2.2 |
| Ex. 34 | 10 | 0.01 | 20 | 1000 | 1010 | 0.01 | 185.5 |
| Ex. 35 | 10 | 0.1 | 20 | 100 | 111 | 0.13 | 19.9 |
| Ex. 36 | 10 | 0.3 | 20 | 33.3 | 48.0 | 0.30 | 7.6 |
| Ex. 37 | 10 | 0.5 | 20 | 20.0 | 40.0 | 0.35 | 5.2 |
| Ex. 38 | 12 | 0.1 | 20 | 120 | 129 | 0.11 | 23.2 |
| Ex. 39 | 12 | 0.3 | 20 | 40.0 | 51.0 | 0.27 | 8.5 |
| Ex. 40 | 12 | 0.5 | 20 | 24.0 | 40.0 | 0.35 | 5.5 |

Comparative Example 1

The heater plate 20 had a thickness of 20 mm, and the heater 40 was embedded 8 mm above the lower surface 22 of the heater plate 20. No recessed portion 23 was formed on the upper surface 21 of the heater plate 20, and the spaces S were not provided, and the lower surface 12 of the RF plate 10 and the upper surface 21 of the heater plate 20 were joined over the entire surfaces. Except for the above, a ceramic heater was produced in the same manner as in Examples 1 to 34.

Evaluation Results

The temperature difference between the RF plate 10 and the heater plate 20 was as small as 1.5° C., which was favorable. However, the leak current generated between the RF electrode 30 and the heater 40 was as large as 1.41 mA, which exceeded 1 mA.

Comparative Examples 2 to 5

The configuration of the recessed portions 23 formed on the upper surface 21 of the heater plate 20 was changed as shown in Table 3. Except for this, ceramic heaters were produced in the same manner as in Examples 1 to 34.

Evaluation Results

The temperature difference between the RF plate 10 and the heater plate 20 was 1.5° C. to 1.8° C., which was as small as less than 200° C., and H/A was 0.2 to 2.0, so that the relational expression (1) was satisfied.

The leak current generated between the RF electrode 30 and the heater 40 was as large as 1.17 mA to 1.25 mA, which exceeded 1 mA. H/A+(D−H)/(1−A) was 11.3 to 12.1, so that the relational expression (2) was not satisfied.

Comparative Examples 6 to 11

The configuration of the recessed portions 23 formed on the upper surface 21 of the heater plate 20 was changed as shown in Table 3. Except for this, ceramic heaters in Comparative Examples 6 to 8 were produced in the same manner as in Examples 1 to 34, and ceramic heaters in Comparative Examples 9 to 11 were produced in the same manner as in Examples 35 to 40.

Evaluation Results

The leak current generated between the RF electrode 30 and the heater 40 was as small as 0.01 mA or less, which was less than 1 mA. H/A+(D−H)/(1−A) was 1208 to 12008, so that the relational expression (2) was satisfied.

However, the temperature difference between the RF plate 10 and the heater plate 20 exceeded 200° C., and H/A was 1200 to 12000, so that the relational expression (1) was not satisfied.

The results of Comparative Examples 1 to 11 are collectively shown in Table 3.

TABLE 3

|  | Space height H [mm] | Contact area proportion A | Distance D [mm] | H/A | H/A+ (D−H)/ (1−A) | Leak current [mA] | Temperature difference [° C.] |
|---|---|---|---|---|---|---|---|
| Com. Ex. 1 | 0 | 1 | 10 | — | — | 1.41 | 1.5 |
| Com. Ex. 2 | 0.02 | 0.01 | 10 | 2.0 | 12.1 | 1.17 | 1.8 |
| Com. Ex. 3 | 0.02 | 0.1 | 10 | 0.2 | 11.3 | 1.25 | 1.5 |
| Com. Ex. 4 | 0.05 | 0.1 | 10 | 0.5 | 11.6 | 1.22 | 1.6 |
| Com. Ex. 5 | 0.1 | 0.1 | 10 | 1.0 | 12.0 | 1.18 | 1.6 |
| Com. Ex. 6 | 2.0 | 0.001 | 10 | 2000 | 2008 | 0.01 | >200 |
| Com. Ex. 7 | 3.0 | 0.001 | 10 | 3000 | 3007 | 0.00 | >200 |
| Com. Ex. 8 | 4.0 | 0.001 | 10 | 4000 | 4006 | 0.00 | >200 |
| Com. Ex. 9 | 10 | 0.001 | 20 | 10000 | 10010 | 0.00 | >200 |
| Com. Ex. 10 | 12 | 0.001 | 20 | 12000 | 12008 | 0.00 | >200 |
| Com. Ex. 11 | 12 | 0.01 | 20 | 1200 | 1208 | 0.01 | >200 |

Example 41

In Example 41, a ceramic heater was produced in the same manner as in Examples 17 to 21 except that the configuration of the recessed portions 23 and the shape of the heater 40 were different.

Figure 2:
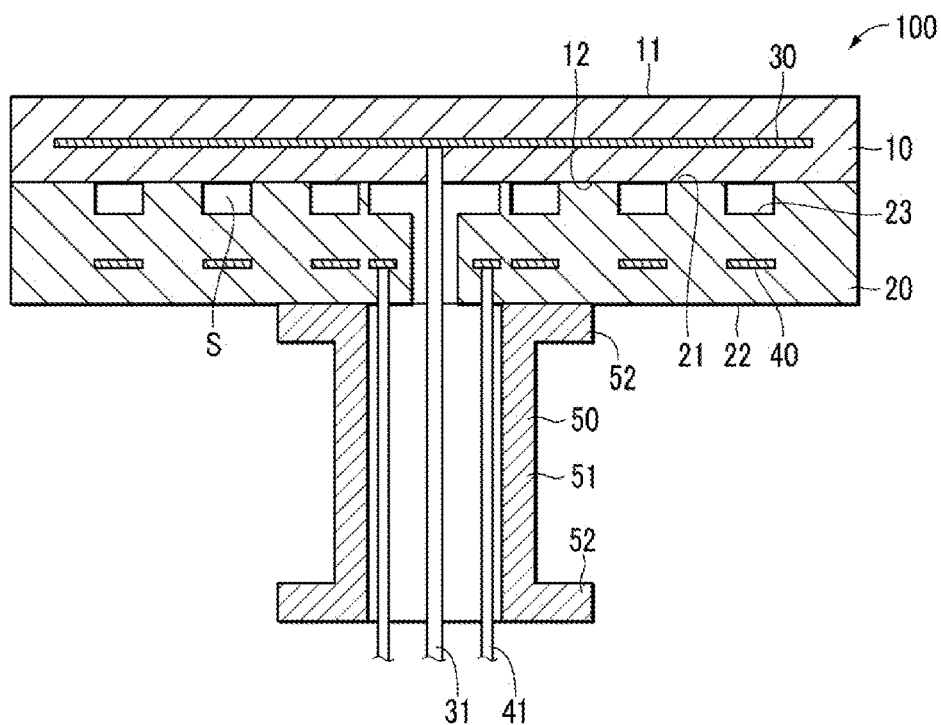
FIG. 2 is a schematic cross-sectional view of a ceramic heater according to a modification of the embodiment of the present invention.

The shape of the heater 40 was defined as shown in FIG. 4 so that the lower surface 12 of the RF plate 10 and the upper surface 21 of the heater plate 20 were joined at such locations as not to overlap the heater 40 in top view. That is, as shown in FIG. 2, a ceramic heater 100 was configured such that the spaces S were present between the RF electrode 30 and the heater 40. The proportion A of the contact area between the RF plate 10 and the heater plate 20 was 0.1 (10%), the minimum height H of the spaces S was 1.0 mm, and the distance D, which is the separation length between the RF electrode 30 and the heater 40 in the vertical direction, was 10 mm.

Evaluation Results

The temperature difference between the RF plate 10 and the heater plate 20 was as small as 3.1° C., which was favorable, and this value was the same as 3.1° C. in Example 19 having the same values for the relational expressions (1) and (2).

The leak current generated between the RF electrode 30 and the heater 40 was as very small as 0.3 mA, and was also smaller than 0.71 mA in Example 19.

Example 42

In Example 42, a ceramic heater was produced in the same manner as in Examples 1 to 34 except that the RF plate 10 and the heater plate 20 were joined via the connection members 60 as shown in FIG. 3.

The connection members 60 were formed integrally with the RF plate 10 by cutting the aluminum nitride sintered body.

The proportion A of the contact area between the connection members 60, and the RF plate 10 or the heater plate 20, was 0.01 (1%), and the minimum height H of the space S was 1.0 mm. At that time, D1 was 5 mm, D2 was 7 mm, and D was 19 mm.

Evaluation Results

The temperature difference between the RF plate 10 and the heater plate 20 was as small as 3.1° C., which was favorable, and H/A was 100, so that the relational expression (1) was satisfied.

The leak current generated between the RF electrode 30 and the heater 40 was as very small as 0.18 mA, and H/A+(D−H)/(1−A) was 118.1, so that the relational expression (3) was satisfied.

Examples 43 to 46

In Examples 43 to 46, in the same ceramic heater 100 as that of Example 18, pipes (not shown) were connected to the spaces S, and helium was supplied from a helium (He) supply source connected to the pipes. The helium gas pressures of the spaces S were set to 1 torr, 5 torr, 10 torr, and 50 torr, respectively.

Evaluation Results

In Examples 43 to 46, the temperature differences between the RF plate 10 and the heater plate 20 were as small as 19.7° C., 17.2° C., 15.2° C., and 12.4° C., respectively, which were favorable. In light of also 19.7° C. of Example 18 in which the helium gas pressure of the spaces S was 0 torr, the temperature difference decreased with an increase in the helium gas pressure of the spaces S.

In all of Examples 43 to 46, the leak current generated between the RF electrode 30 and the heater 40 was 0.13 mA, which was the same as that of Example 18, so that the helium gas pressure in the spaces S had no influence on the magnitude of the leak current.

DESCRIPTION OF REFERENCE NUMERALS

10: RF plate (first base body)
11: placement surface (upper surface)
12: lower surface
20: heater plate (second base body)
21: upper surface
22: lower surface
23, 24: recessed portion
30: RF electrode (electrode)
31: power feed terminal
40: heater (heating resistor)
41: power feed terminal
50: shaft
51: cylindrical portion
52: large diameter portion
60: connecting member
61: upper surface
62: lower surface
100: ceramic heater (ceramic member)
S: space

What is claimed is:

1. A ceramic member comprising:
   a first base body having a placement surface on which a wafer is to be placed and a side opposite to the placement surface, and made of a ceramic sintered body in which an electrode is embedded; and
   a second base body made of a ceramic sintered body in which a heating resistor is embedded,
   the first base body and the second base body being joined to each other with a space interposed therebetween on the side opposite to the placement surface wherein a relationship among:
   a minimum height, H, measured in millimeters, of the space in a direction perpendicular to the placement surface;
   a proportion, A, of a total area of portions where the first base body and the second base body are joined to an area of a plane along the placement surface that is defined by an outer edge of the placement surface; and
   a distance, D, measured in millimeters, between the electrode and the heating resistor,
   satisfies H/A≤1000 and H/A+(D−H)/(1−A)≥14.

2. The ceramic member according to claim 1, wherein the relationship satisfies: H/A+(D−H)/(1−A)≥100.

3. The ceramic member according to claim 1, wherein the space is at least partially filled with a medium having a higher thermal conductivity than that of air.

4. The ceramic member according to claim 1, wherein the space is in communication with a supply source of a medium having a higher thermal conductivity than that of air.

5. The ceramic member according to claim 2, wherein the space is at least partially filled with a medium having a higher thermal conductivity than that of air.

6. The ceramic member according to claim 2, wherein the space is in communication with a supply source of a medium having a higher thermal conductivity than that of air.

7. The ceramic member according to claim 1, wherein a plurality of spaces are interposed between the first base body and the second base body, and
   wherein each of the plurality of spaces is either a closed space or a space to which gas is supplied.

8. The ceramic member according to claim 7, wherein at least one of the plurality of spaces is a closed space and at least one of the plurality of spaces is a space to which gas is supplied.

* * * * *